(12) United States Patent
Mokhlesi

(10) Patent No.: US 6,643,187 B2
(45) Date of Patent: *Nov. 4, 2003

(54) COMPRESSED EVENT COUNTING TECHNIQUE AND APPLICATION TO A FLASH MEMORY SYSTEM

(75) Inventor: Nima Mokhlesi, Los Gatos, CA (US)

(73) Assignee: SanDisk Corporation, Sunnyvale, CA (US)

( * ) Notice: Subject to any disclaimer, the term of this patent is extended or adjusted under 35 U.S.C. 154(b) by 104 days.

This patent is subject to a terminal disclaimer.

(21) Appl. No.: 10/033,222

(22) Filed: Dec. 27, 2001

(65) Prior Publication Data

US 2002/0075728 A1 Jun. 20, 2002

Related U.S. Application Data

(63) Continuation of application No. 09/662,032, filed on Sep. 14, 2000, now Pat. No. 6,345,001.

(51) Int. Cl.⁷ .............................................. G11C 16/04
(52) U.S. Cl. ......................... 365/185.33; 365/185.29; 365/185.11; 365/218
(58) Field of Search .................. 365/185.33, 185.29, 365/185.11, 218, 236, 230.03, 189.07

(56) References Cited

U.S. PATENT DOCUMENTS

| | | |
|---|---|---|
| 5,043,940 A | 8/1991 | Harari |
| 5,172,338 A | 12/1992 | Mehrotra et al. |
| 5,200,959 A | 4/1993 | Gross et al. |
| 5,270,979 A | 12/1993 | Harari et al. |
| 5,315,541 A | 5/1994 | Harari et al. |
| 5,341,339 A | 8/1994 | Wells |
| 5,369,754 A | 11/1994 | Fandrich et al. |
| 5,428,621 A | 6/1995 | Mehrotra et al. |
| 5,430,859 A | 7/1995 | Norman et al. |
| 5,532,962 A | 7/1996 | Auclair et al. |
| 5,568,423 A | 10/1996 | Jou et al. |
| 5,602,987 A | 2/1997 | Harari et al. |
| 5,625,791 A | 4/1997 | Farrugia et al. |
| 5,663,901 A | 9/1997 | Wallace et al. |
| 5,712,180 A | 1/1998 | Guterman et al. |
| 6,081,447 A | 6/2000 | Lofgren et al. |
| 6,388,259 B1 | 5/2002 | Murdock |

FOREIGN PATENT DOCUMENTS

| | | |
|---|---|---|
| JP | 61-100565 | 6/1986 |
| JP | 401205792 A | 8/1989 |
| WO | WO 00/16182 | 3/2000 |

OTHER PUBLICATIONS

"Notification of Trasmittal of the International Search Report or the Declaration" from corresponding PCT application, mailing date Oct. 22, 2002, 6 pages.

Ross, "Stochhastic Processes," 1993, by John Wiley & Sons, Inc., pp. 1–141.

Primary Examiner—David Lam
(74) Attorney, Agent, or Firm—Parsons Hsue & de Runtz LLP

(57) ABSTRACT

A non-volatile flash memory system counts the occurrences of an event, such as the number of times that individual blocks have been erased and rewritten, by updating a compressed count only once for the occurrence of a large number of such events. A random or pseudo-random number generator outputs a new number in response to individual occurrences of the event, and updates the compressed count when an output of the random number generator matches a predetermined number. The probability of the predetermined number being generated by the random number generator in response to a single event may be varied as the function of some other factor, such as the value of the compressed count, when that provides more useful tracking of the number of events. These techniques also have application to monitoring other types of recurring events in flash memory systems or in other types of electronic systems.

13 Claims, 4 Drawing Sheets

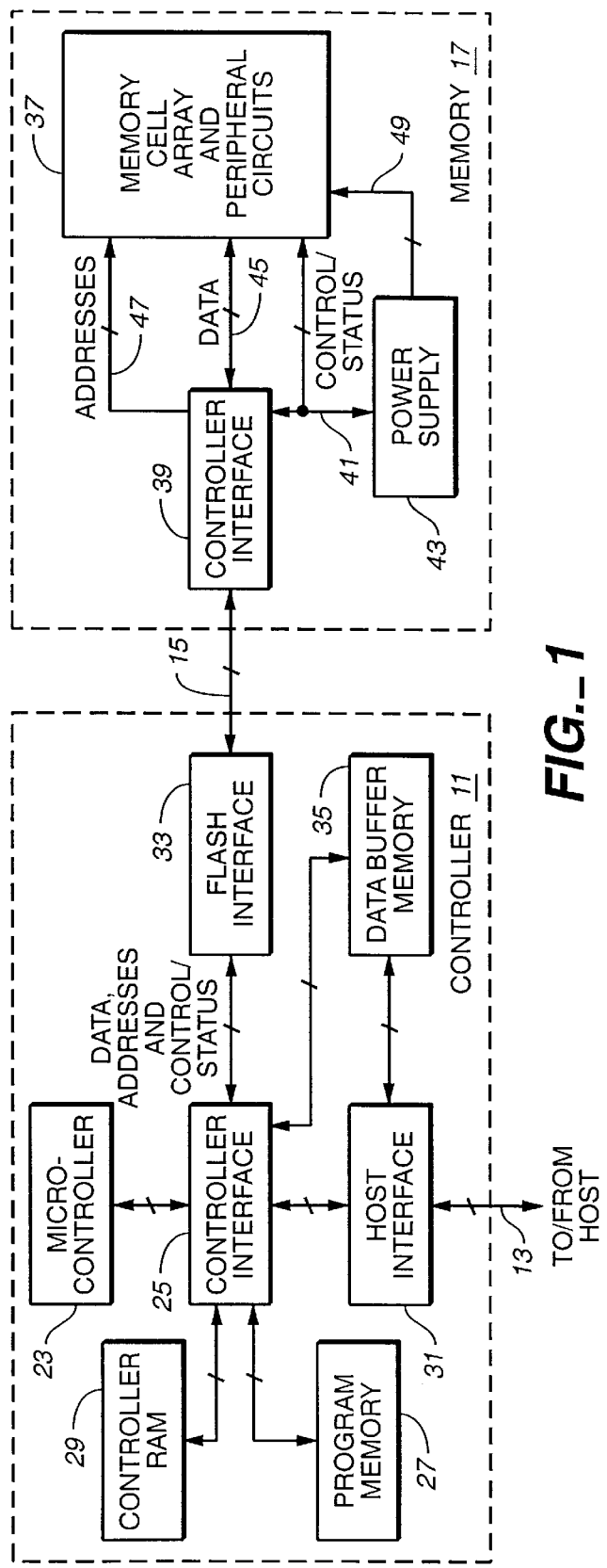
FIG._1

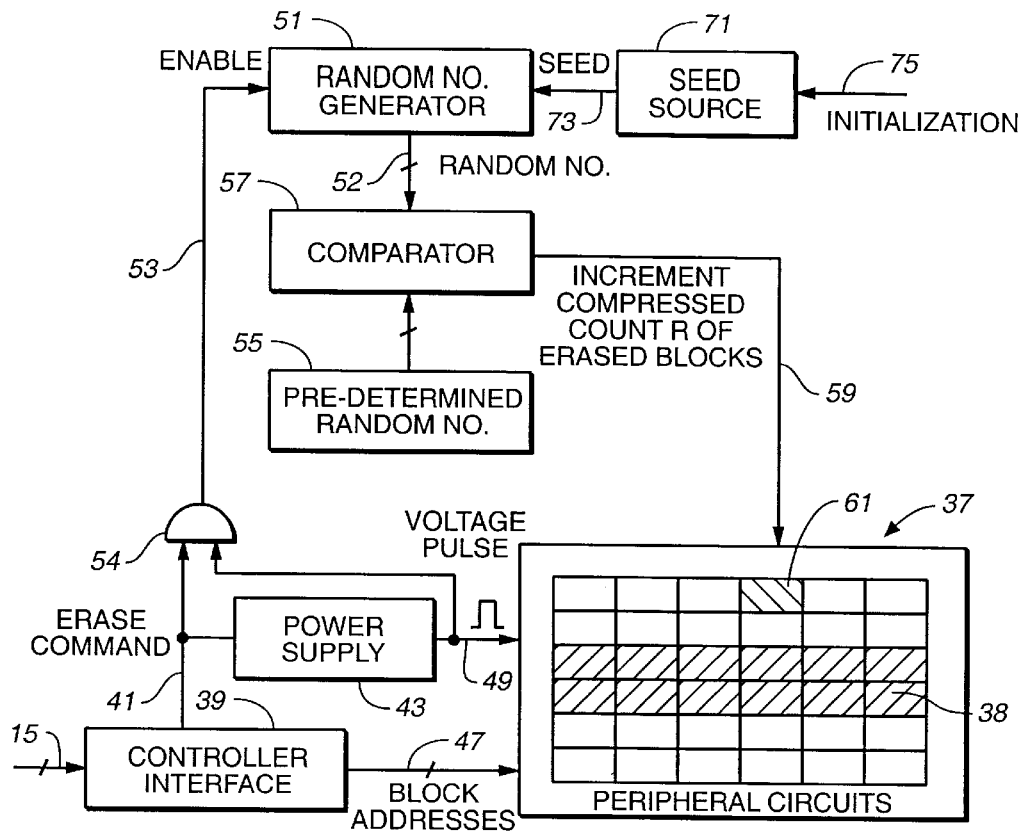
FIG._2
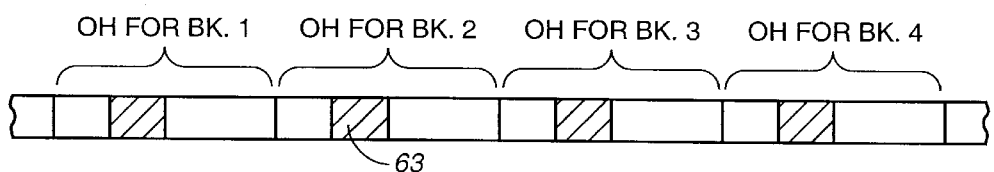
FIG._3 RESERVED BLOCK
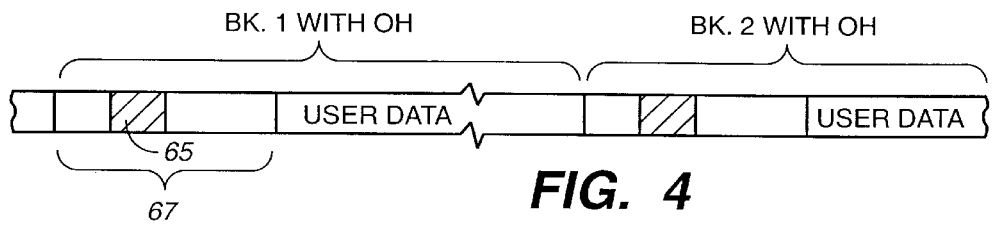
FIG. 4

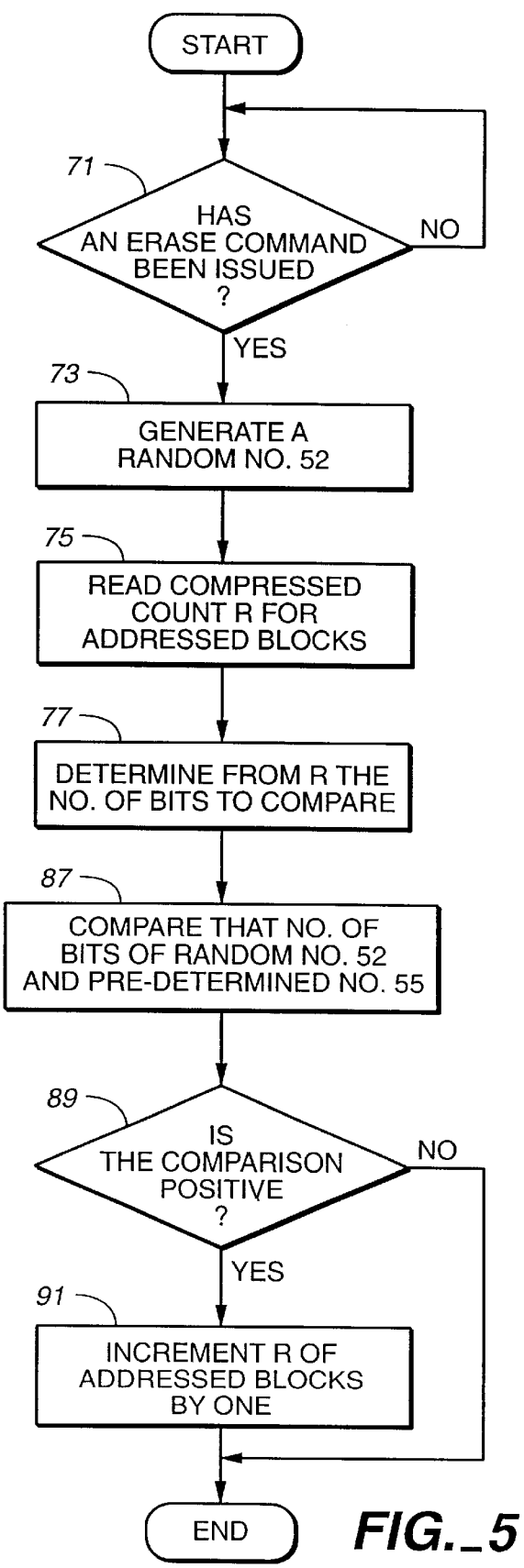
FIG._5

| COMPRESSED COUNT R | NO. BITS COMPARED | PROBABILITY P |
|---|---|---|
| 0-15 | — | 1.0 |
| 16-31 | 1 | 0.5 |
| 32-47 | 2 | 0.25 |
| 48-63 | 3 | 0.125 |
| 64-79 | 4 | 0.0625 |
| 80-96 | 5 | 0.03123 |
| ⋮ | ⋮ | ⋮ |
| 240-255 | 16 | 0.0000305 |
FIG._6
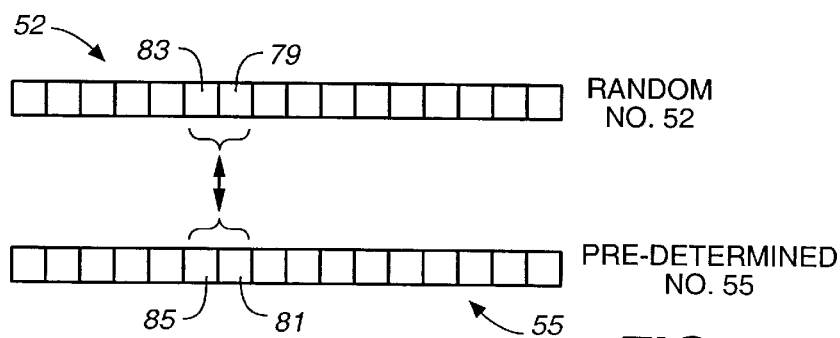
FIG._7
| COMPRESSED COUNT R | ACTUAL COUNT R | ERROR (STD. DEVIATION) |
|---|---|---|
| 0 | 0 | 0 |
| 1 | 1 | 0 |
| 2 | 2 | 0 |
| ⋮ | ⋮ | ⋮ |
| 15 | 15 | 0 |
| 16 | $17 + X_{16}$ | $Y_{16}$ |
| ⋮ | ⋮ | ⋮ |
| 31 | $47 + X_{31}$ | $Y_{31}$ |
| 32 | $52 + X_{32}$ | $Y_{32}$ |
| ⋮ | ⋮ | ⋮ |
| 47 | $111 + X_{47}$ | $Y_{47}$ |
| 48 | $119 + X_{48}$ | $Y_{48}$ |
| ⋮ | ⋮ | ⋮ |
FIG._8

COMPRESSED EVENT COUNTING TECHNIQUE AND APPLICATION TO A FLASH MEMORY SYSTEM

CROSS-REFERENCE TO RELATED APPLICATION

This is a continuation of patent application Ser. No. 09/662,032, filed Sep. 14, 2000, now U.S. Pat. No. 6,345,001, which application is incorporated herein by this reference.

BACKGROUND OF THE INVENTION

This invention relates generally to event counting techniques, and, more specifically, to the application of such techniques to semiconductor memory systems, particularly to non-volatile flash electrically-erasable and programmable read-only memories (EEPROMs).

Flash EEPROM systems are being used in a wide variety of applications, particularly when packaged in an enclosed card that is removably connected with a host system. Current commercial memory card formats include that of the Personal Computer Memory Card International Association (PCMCIA), CompactFlash (CF), MultiMediaCard (MMC) and Secure Digital (SD). One supplier of these cards is SanDisk Corporation, assignee of this application. Host systems with which such cards are used include personal computers, notebook computers, hand held computing devices, cameras, audio reproducing devices, and the like. Flash EEPROM systems are also utilized as bulk mass storage embedded in host systems.

Such non-volatile memory systems include an array of memory cells, peripheral operating circuits and a system controller. The controller manages communication with the host system and operation of the memory cell array to store and retrieve user data. The memory cells are grouped together into blocks of cells, a block of cells being the smallest grouping of cells that are simultaneously erasable. Prior to writing data into one or more blocks of cells, those blocks of cells are erased. User data are typically transferred between the host and memory array in sectors. A sector of user data can be any amount that is convenient to handle, preferably less than or equal to the capacity of the memory block, often being equal to the standard disk drive sector size, which is 512 bytes.

In one commercial architecture, the memory system block is sized to store one sector of user data plus overhead data, the overhead data including information such as an error correction code (ECC) for the user data stored in the block, a count of the number of times that the block has been erased and reprogrammed, defects and other physical information of the memory cell block, and programming and/or erase voltages to be applied to the block. Various implementations of this type of non-volatile memory system are described in the following United States patents and pending applications, each of which is incorporated herein in its entirety by this reference: U.S. Pat. Nos. 5,172,338, 5,602,987, 5,315,541, 5,200,959, 5,270,979, 5,428,621, 5,663,901, 5,532,962, 5,430,859 and 5,712,180, and patent application Ser. Nos. 08/910,947, filed Aug. 7, 1997, and Ser. No. 09/343,328, filed Jun. 30, 1999. In another commercial architecture, the overhead data for a large number of blocks storing user data are stored together within tables in other blocks. This overhead data includes a count of the number of times that individual user data blocks have been erased and reprogrammed. An example of such a system is described in U.S. patent application Ser. No. 09/505,555, filed Feb. 17, 2000. Yet another type of non-volatile memory system utilizes a larger memory cell block size that stores multiple sectors of user data.

The number of erase/reprogramming cycles experienced by individual memory blocks (their "experience count") is often maintained within a flash memory system for one or more reasons. One reason is to determine when a block is reaching its end of lifetime, in order to replace it with another block by mapping it out of the system before it fails from overuse. This is described in U.S. Pat. No. 5,043,940, for example, which patent is incorporated herein by this reference. Current commercial floating gate memory cells have a lifetime of from several hundred thousand to one million erase/reprogramming cycles, which is often larger than any of the blocks are cycled in most applications during the useful life of the memory. However, other more reprogramming intensive applications can reach such numbers. Another reason for keeping track of the block experience counts is to be able to alter the mapping of data into the various blocks in order to even out their wear before they reach their ends of lifetime as a way of extending the life of the memory system. Examples of such wear leveling techniques are given in U.S. Pat. No. 6,081,447, which patent is incorporated herein in its entirety by this reference. Yet another reason for maintaining block experience counts is to be able to adjust programming and other operating voltages to take into account changes in characteristics of the memory cells that occur as the number of erase/reprogramming cycles increases.

SUMMARY OF THE INVENTION

Rather than keeping track of each occurrence of an event, it is noted only each time a large number of events has occurred. One advantage is that a compressed count R, representative of the number of events A that has occurred, needs to be updated less frequently than if each of the events is counted. Another advantage is that, in a binary counting system, a fewer number of bits are required to maintain a count R that is representative of a larger number of events A. A preferred technique for maintaining the compressed count R includes establishing some probability P that the compressed count R will be updated each time that the event being monitored occurs. This results in updating the compressed count R, on average, once every 1/P number of actual events. This probability is preferably chosen to be as independent of the operation of a system in which the events are occurring as is practical, so that the influence of the system operation upon the frequency of updating the compressed count R is minimized.

In the specific examples described herein, this technique is utilized to monitor the number of some repetitive event that occurs as part of operating an electronic system. A random number generator is preferred for use to determine when the compressed count R of the number of events is updated, a pseudo-random number generator usually being used in practice. A random number is generated when the event occurs, preferably each time the event occurs. One of the random numbers is preferably designated as a trigger to cause the compressed count R to be updated, such as by being incremented to the next number in order. This will occur, on the average, once every N events, where N is the total possible number of distinct random numbers that is generated over time by the random number generator. Rather than each occurrence of the event being counted, therefore, the compressed count R is updated on average once every N events, and that count represents 1/N th the number of events that have occurred, on average. Or, to say it in a different way, the probability P that any one occurrence of an event will result in the compressed count R being updated is 1/N. A product of R and N gives the number of actual events A that has occurred, if that is needed, within a margin of probable error that is proportional to 1/P, which is to say that the likely error goes up as N goes up since P=1/N.

These techniques have particular application to digital memory systems. In the example of non-volatile flash memory systems described in the Background above, updating the compressed count R of an event, such as the erase/reprogramming event, need occur less frequently, so less time is taken away from other operations of the memory. This results in such other operations, such as user data programming, occurring faster. The number of bits required to store the count for each of the blocks is also significantly reduced. Further, the complexity of the operation of the memory system is reduced when each occurrence of the event need not be counted.

In an application of this technique to maintain an experience count (sometimes called a "hot" count) of the number of erasures and reprogramming cycles occurring in a flash memory, the number N is selected to be a small fraction of M, where M is the expected life of the memory in terms of a maximum number of erase/reprogramming cycles that a memory cell can safely experience before there is danger of very inefficient operation or outright failure. Although the resulting compressed count R does not allow knowing exactly the number of events A that have occurred, it's relative accuracy increases as the number of events A grows and particularly when approaching the end M of the memory block's lifetime. The number of bytes of storage space required for the experience count can be significantly reduced since the maximum compressed count R over the life of the memory is M divided by N, rather that being M in the case where every erasure event is counted. Since updating of the compressed count occurs only once for many erasure events, the overall performance of the memory is improved. In addition, the flash memory system is easier to maintain and debug.

The probability P that any particular one of such events will cause the compressed count to be updated need not necessarily be kept the same for the entire time that the events of the memory or other electronic system are being counted but rather can, for example, be varied as a function of the number of events A being monitored. Specifically, if it is desired to maintain a more accurate compressed count R of the erasure/reprogramming events of a flash memory at low values of the actual count A, the probability P is maintained high at the beginning of operation and decreased during the lifetime of the memory as the actual count A becomes large. This is particularly useful, as a specific example, when the compressed count R is being used by the system to control the voltages applied to the memory cells of a particular block during its programming and/or erase, since those voltages are often changed at low levels of the actual experience count A. This ability is provided without having to devote more bits to the storage of the compressed count R for the individual blocks.

Additional aspects, features and advantages of the present invention are included in the following description of specific representative embodiments, which description should be taken in conjunction with the accompanying drawings.

BRIEF DESCRIPTION OF THE DRAWINGS

FIG. 1 is a schematic block diagram of a memory system that incorporates event monitoring of the present invention;

FIG. 2 is a block diagram that conceptually illustrates operation of the memory system of FIG. 1 to keep a compressed count of events occurring within it;

FIG. 3 illustrates one form of non-volatile storage within the memory system of FIG. 1 of a compressed count of the events according to the techniques shown in FIG. 2;

FIG. 4 illustrates another form of non-volatile storage within the memory system of FIG. 1 of a compressed count of the events according to the techniques shown in FIG. 2;

FIG. 5 is a flow chart of a specific example of the operation of the memory system of FIG. 1 according to FIG. 2;

FIG. 6 is a table used with the example operation of FIG. 5;

FIG. 7 shows a comparison of two binary numbers that is used in the example of FIG. 5; and FIG. 8 is another table used in the example of FIG. 5.

DESCRIPTION OF REPRESENTATIVE EMBODIMENTS

FIG. 1 is a diagram of some of the major components of a typical non-volatile memory system. A controller 11 communicates with a host system over lines 13. The controller 11, which may occupy its own integrated circuit chip, communicates over lines 15 to one or more non-volatile memories in parallel, one memory 17 being illustrated. The memory 17 includes a memory cell array and associated peripheral circuits 37, which may, along with a controller interface 39, be formed on a separate integrated circuit chip.

User data is transferred between the controller 11 and the memory 17, in this example, over the lines 15. The memory 17 is addressed by the controller. Specifically, the data bus within the lines 15 can be one byte wide. The memory system shown in FIG. 1 can be embedded as part of a host system or packaged into a card, such as a card following one of the card standards previously mentioned. In the case of a card, the lines 13 terminate in external terminals on the card for mating with a complementary socket within a host system. Although use of one controller chip and multiple memory chips is typical, the trend is, of course, to use fewer separate chips for such a system by combining their circuits. An example capacity of the illustrated memory 17 is 256 Mbits, thus requiring only two such memory chips, plus the controller chip, to form a non-volatile memory system having a data capacity of 64 megabytes. Use of a single smaller capacity memory chip results in a memory system of lesser capacity, an 8 megabyte system being a marketable example. Conversely, use of memory chips with a higher bit storage density and/or use of more memory array chips in a system will result in a higher capacity memory. Such memory systems up to 1.3 gigabyte and more are practical.

The controller 11 includes a micro-processor or micro-controller 23 connected through controller interface logic 25 to internal memories and interfaces with external components. A program memory 27 stores the firmware and software accessed by the micro-controller 23 to control the memory system operation to read data from the connected memory array(s) and transmit that data to the host, to write data from the host to the memory array(s), and to carry out numerous other monitoring and controlling functions. The memory 27 can be a volatile re-programmable random-access-memory (RAM), which is then initialized by data from some form of non-volatile memory, a non-volatile memory that is not re-programmable (ROM), a one-time programmable memory (OTP) or a re-programmable flash EEPROM system. If the memory 27 is re-programmable, the controller can be configured to allow the host system to program it. A random-access-memory (RAM) 29 is used to store, among other data, data from tables read from the non-volatile memory that are accessed during reading and writing operations.

A logic circuit 31 interfaces with the host communication lines 13, while another logic circuit 33 interfaces with the memory array(s) through the lines 15. Another memory 35 is used as a buffer to temporarily store user data being transferred between the host system and the memory 17. The memories in the controller are usually volatile, except for that storing operating firmware, since memories with fast access and other characteristics desired for efficient controller operation have that characteristic. The several volatile memories may conveniently be combined physically into a single memory.

The logic circuit 39 of the memory 17 interfaces with the controller through the lines 15. The purpose of the logic circuit 39 is to generate signals for the memory cell array 37 that are delivered over separate buses and control lines. Various control signals are provided in lines 41. A data bus 45 carries user data being programmed into or read from the non-volatile memory, and an address bus 47 carries the addresses of the portion of the memory being accessed for reading user data, writing user data or erasing blocks of memory cells. A power control circuit 43 provides, in response to control signals in the circuits 41, various voltages and currents as required to operate the memory cell array 37 through lines 49. Included are voltages to bit lines and gates of the memory cell array 37 that are appropriate for programming, reading or erasing certain of those cells that are designated by an address in lines 47.

In one typical flash memory implementation, the memory cells of the array are divided into blocks wherein each block is the smallest erasable unit of memory cells, all cells within an individual block being simultaneously erasable. Typically, a number of blocks are erased at the same time, and programming data into the memory array occurs in blocks that have first been erased. In a common example, each block holds 512 bytes of user data plus a number of bytes of overhead data associated with the user data and/or associated with the block of memory cells in which the overhead data are stored. Such a block is formed of two rows of memory cells, in one specific current implementation. In another example, each block holds 32768 (=64×512) bytes of user data plus overhead data. As an alternative to storing the overhead data in the same block as the user data, some or all of the overhead data may be stored in other blocks that are dedicated for that purpose.

One of the items of overhead information associated with each block of current flash memories in a number of flash EEPROM systems is the number of erase/reprogramming cycles the block has experienced. This block experience count is useful for many purposes, the primary ones having been described earlier. When a block experience count is updated to note an event of either the block's erasure or reprogramming, the current experience count stored for the block in the non-volatile memory is first read and stored in a temporary memory, usually volatile memory within the controller. This read count is then updated to represent the occurrence of a subsequent event, such as by incrementing the count by one, and the updated count is then rewritten back into the non-volatile memory block. This involves a significant number of operations that take time and which thus negatively impact upon the performance of the memory system.

According to a principal implementation of the present invention, the experience counts are not updated each time that their associated blocks are erased and reprogrammed. Rather, a compressed count is updated less frequently at an average rate that is related by a proportional constant to the rate of the erase/reprogramming events being counted. For example, if a flash memory has a life of approximately 1,000,000 erase/reprogramming cycles, and the compressed count is updated only once in approximately 4000 cycles, then the updating process occurs only 1/4000 as often over the occurrence of a large number of cycles. The amount of time devoted to updating the compressed experience count during operation of the memory is significantly less than when an experience count is updated by each event. In addition, the number of bits necessary to store the count being maintained is significantly reduced from that required to maintain the actual count, so the space taken in the non-volatile memory to maintain the count is significantly reduced. If an actual count of 1,000,000 cycles is kept, for example, about 3 bytes is required for every block to count each number from 1 to 1,000,000. If an average of only every $4000^{th}$ event is counted, on the other hand, the maximum count is about 250, and this may be maintained in one byte. The savings in overhead memory space is thus two bytes per block, in this example.

An indication of the actual number of events experienced by a block is always available by multiplying the maintained count by 4000, in this example, but the memory system operating firmware stored in the controller memory 27 preferably works with the compressed count directly as an indication of the usage of the individual blocks. The same advantages of improved performance and reduced memory space requirements result by reducing the frequency of updating the monitoring the count of the occurrences of any other event, whether within a non-volatile memory or in some other electronic system.

A preferred technique for maintaining the compressed count includes generating a series of random numbers wherein a new number is generated in response to each new event and the compressed count is updated each time the generated random number is equal to a predetermined selected one of those numbers. For example, if a generator of random numbers from 1–4000 is employed, where a new number is generated each time the event occurs, and a particular number, say 2750, is selected to update the maintained count when it occurs, the compressed count will be updated each time the random number generator output is equal to 2750. On average, this will occur once each 4000 events. Although there is not a precise relationship between the number of events that have occurred and the compressed count, there is a close correlation, particularly after a large number of events has occurred. It has been found that the accuracy of the compressed count is sufficient for the purposes of the example being described, particularly after several hundred thousand events have occurred. This is when the experience count information becomes quite useful, in the example application being described, for determining when individual blocks of memory need to be replaced.

FIG. 2 conceptually illustrates this process implemented in the non-volatile memory system of FIG. 1, as an example. A random number generator 51 outputs in lines 52 a new random number each time an increment pulse is applied in a line 53. The increment pulse occurs at the beginning of a voltage pulse in the line 49 at a time when a command in lines 41 designates an erase operation. This combination of signals is illustrated to be identified by an AND-gate 54. It is during such an erase voltage pulse that one or more memory cell blocks 38 of the memory 37, as designated by an address in lines 47, are simultaneously erased. In one specific implementation, 16 blocks are erased at the same time. Typically, a single erase voltage pulse is applied.

One number contained within the set of numbers associated with the random number generator is stored in a predetermined location within the system in a non-volatile manner, as indicated by 55. Each new number in lines 52 that is generated by the random number generator 51 is compared with that stored in the memory 55 by a comparator 57. When the two numbers match, a signal in a line 59 causes the compressed count R to be updated for each of the blocks that is currently being erased. When the comparison is negative (i.e., the two numbers do not match), which will be the case most of the time, no such update takes place. This comparison can be implemented in hardware using logic gates, in software or in firmware depending on speed requirements, the need for flexibility and cost considerations.

In one embodiment, the counts are maintained for a number of user data blocks in a single one of many reserved blocks, such as a reserved block 61. An outline of the data structure for such a reserved block is given in FIG. 3. Several bytes of overhead data are maintained in such a block for each of a large number of other blocks that store user data, that number depending upon the capacity of the various blocks. The overhead ("OH") data for memory cell block 2, for example, includes a byte 63 of the compressed count that is updated when a match occurs between the random number generator output 52 and the stored number 55.

In another embodiment, instead of the counts being maintained in a separate reserved block 61, they are stored as part of the blocks for which the counts are being maintained. For example, with reference to FIG. 4, a compressed count byte 65 is stored as part of overhead data 67 for a memory cell block 1, the majority of the cells in the block storing user data. Thus, when a number of blocks are erased together, the compressed count of each block is updated when the random number 52 matches that stored at 55 at the time of the erase operation. Nothing is done at that time with the compressed count of other blocks not being erased.

Yet, in another embodiment, the counts are stored in a block that is exclusively devoted to storing the counts and no other kind of overhead data.

The random number generator 51 may be implemented according to any one of many known hardware and/or software techniques. In a specific implementation, however, the function of the random number generator 51 is carried out by the micro-controller 23 of the memory controller 11 (FIG. 1). The micro-controller 23 is generally idle for the duration of an erase pulse, so it can be used during such pulses to perform the functions of generating a new random number 52 and comparing that number with the predetermined number 55 to determine whether a match exists or not. A standard shift and exclusive-OR algorithm is used, wherein a 32 bit value is stored in the controller RAM 29 and a 12 bit random (actually pseudo-random by this technique) number is generated in lines 52 from it in response to each erase command. A 12 bit number provides 4096 different possible combinations. If the lifetime of the memory is about one million cycles, then one byte will store the compressed count that is representative of the actual number of events. On the occurrence of each erase event, the probability P of the generated random number 52 matching the number stored in 55 is one in 4096.

The random number generator, to provide more detail, uses a 32 bit shift register formed in the controller RAM 29 (FIG. 1). Every new random number is generated by repeatedly performing an exclusive-OR operation on the second and third least significant bits of the shift register, and feeding the resultant bit to the most significant bit of the shift register during a shift operation of all the 32 bits of the shift register. To generate a new 16 bit random number, this operation is repeated 16 times. Then the 4 most significant bits of the 16 least significant bits of the shift register are masked by performing an AND operation between the 16 least significant bits of the shift register, and the hexadecimal number 0FFFh (0000 1111 1111 1111 in binary form). So every time the 12 least significant bits of the shift register become 000h (0000 0000 0000 in binary form) the output of the logical AND operation becomes one, and there is a hit (match) in the sense that, on such occasions, the compressed count R is incremented. If all 32 bits of the shift register ever become identically zeros, then from that point on all subsequent random numbers generated will also be zero. So, if this does happen, the random number generator is re-seeded.

It will be noted that the probability P may be generated by some means other than the random number generator 51 specifically described above. Examples include using system noise, tunneling events in single electron devices, radio active decay in a certain time interval, and other events that randomly occur in some hardware, firmware or software device. Other suitable random number generating techniques are additionally described below for use in developing a seed to initialize the random number generator 51.

Upon the memory system being initiated, as the result of being powered up from an un-powered condition, the random number generator 51 needs to be set to an initial value in order to begin the process. This is done by a seed source 71 that is triggered by an initialization signal in line 75 to provide an initial value seed 73 to the random number generator 51.

There are many alternative seed sources that can be employed. One is to store, in a non-volatile manner, the last value 52 of the random number generator 51 during operation of the memory system prior to the initialization. The random number generator 51 is then forced to begin with that stored number. But using a random number or non-correlated number source as the seed also performs satisfactorily. In systems that include a time clock, the generated time is a pseudo-random series of numbers, the number existing at the time of initialization being used as the seed for the random number generator 51. Alternatively, a second random number generator, of the same or different design than the random number generator 51, may be used to select a seed. For the random number generator specifically described above, re-seeding includes initializing all 32 bits of the shift register.

Yet another alternative technique for generating a seed involves reading user data in a block of the memory which can be read in a normal manner. But to assure a higher degree of randomness, in case the data does not change between initializations, that reading is performed, in one specific implementation, with margin threshold levels that are separated by amounts far in excess of those normally used for reading data. This is intended to assure, due to the marginality of the readings, that many errors will occur in reading that data, preferably in a manner that at least some of the same data are read differently at different times. To further increase the randomness of the seed, an address of a second block may be generated from this intentionally erroneously read data, and the data in the second block is read in the same manner that is likely to erroneously read the data. This can be continued for a further number of cycles if additional assurances of randomness are desired.

In the description given above, it has been assumed that the probability P of a match occurring remains the same throughout the life of the memory system. There can be applications, however, where it is desired to vary the probability P in some manner, such as in response to some relevant condition that changes or to a related event that occurs. That probability can be altered, if desired, by changing the number of predetermined numbers in the storage 55 with which each of the random numbers 52 from the generator 51 is compared. The compressed count is updated each time there is a match of the generated random number with any of the one, two or even more predetermined numbers in the storage 55. As the number of predetermined numbers within the storage 55 that are made available for comparison with the random number outputs of the generator 51 is altered, the probability P of a match occurring for any given random number is changed.

As an alternative to changing the number of stored predetermined numbers that are compared in order to alter the probability, the number of bits of a single number in the storage 55 and the individual random numbers that are compared may be altered, in a digital system. For example, if the random number output 52 of the random number generator 51 is 12 bits and the predetermined number stored at 55 is also 12 bits, the lowest probability of a match (one in 4096) occurs when a positive comparison of all 12 bits is required. But if only two bits in the same location of each number are compared, as another example, there is a much higher probability of a match (one in four) occurring as the result of each comparison. This, in effect, alters the total number of possible different random numbers that may be generated by the random number generator, and, in that way, changes the probability that any one random number will match the pre-determined number. The number of bits of the two numbers that are compared, and thus the total number of possible random numbers, is easily altered under firmware or software control in response to a user's selection, or automatically changed in response to a change being detected in some other condition or event of the memory system.

One specific application in a flash memory system of varying the probability of a match occurring is described with respect to the flowchart of FIG. 5. This operating method increments the compressed count R more often at lower numbers of R which usually correspond to lower numbers of the actual counts A than at higher numbers, thus resulting in the compressed count R more accurately representing the actual count A at the lower numbers. The resolution of the compressed count R at lower numbers is thus improved. This can be accomplished without having to increase the number of bits required to store the compressed count R by initially using a high value of P at low values of R, and proceeding to lower values of P (which can become lower than 1/4096 and in fact can become as low as 1/32768) at higher values of R. By using this approach, an integer R ranging from 0 to 255 can represent counts as high as 1 million for the high count range, and as low as single digit numbers for the lowest count range. In the specific flash EEPROM system example described herein, the total number of binary random number bits that are compared to the same number of bits of the pre-designated number can be designed to be a function of the value of the compressed count R of each block being erased.

In the specific example being described with respect to FIGS. 5–8 to illustrate this feature, both of the random number 52 generated by the generator 51 (FIG. 2) and the stored predetermined number 55 are each 16 bits in length. A different number of the bits of each are compared by the comparator 57, depending upon the value of the compressed count R. Fewer bits are compared (thus a higher probability of a match occurring) at lower values of the compressed count R than at higher values (where the probability of a match occurring is lower). The compressed count R is stored in one byte, having a range of 0–255.

Referring to FIG. 5, a first step 71 in a summary of the process is to determine when an erase operation is being performed. When this occurs, in a step 73, the random number generator 51 is caused to generate a random number 52 (see also FIG. 7). In a next step 75, the compressed count R for the blocks that are currently addressed for erase is read from its non-volatile record 61. This is not shown in FIG. 2 but will be understood to be implemented by the microcontroller 23 (FIG. 1) which preferably also performs the processing illustrated in FIG. 2, as previously mentioned. A table such as that illustrated in FIG. 6 is stored in non-volatile memory, of the controller for use during a next step 77. The logic represented by this table can be implemented in hardware, firmware, or software.

The number of bits of the numbers 52 and 55 (FIG. 7) that are to be compared is determined by looking up the read compressed counts Rs in the table of FIG. 6 for each of the blocks being erased in its left-hand column and reading the number of bits to be compared in its middle column. A right hand column of FIG. 6 provides, as information for this explanation, the probability P that a match will occur between the bits of the numbers 52 and 55 that are compared. It will be noted that no bits are compared for the lowest values 0–15 of R since they equal respective ones of the actual count values 0–15 of A. On each occurrence of the erase event for blocks whose R is 15 or less, therefore, that R is incremented by one. But within a next range where R is within 16–31, one bit of each number, such as the bits 79 and 81 in the same bit positions of each of the numbers 52 and 55, are compared. There is thus a probability of 0.5 that a match will occur in each instance. In a next range of R between 32–47, two bits, such as bits 79 and 83 of the number 52 and bits 81 and 85 of the number 55, are compared, resulting in a probability of 0.25 that a match will occur in any one instance. As the compressed count R increases to its highest range of 240–255, 15 of the 16 bits are compared, resulting in a very low probability (1 in 32768) that a match of 15 of the 16 bits will result from any one comparison.

The number of bits of the numbers 52 and 55 are looked up in the table of FIG. 6, the comparison then occurring in a step 87 (FIG. 5). A next step 89 determines whether on an individual block basis there is a match or not. If so, the compressed count R of only those individual blocks that have satisfied the match within the addressed blocks that were read in the step 75 is incremented by one, in a step 91. If no block in the group of blocks being erased produces a match, then the process ends with respect to the blocks being erased, and receipt of another erase command is awaited by the step 71.

Although the examples being described include incrementing various numbers, one or more could be decremented instead, from a high value to a low value. It is not usually important how the compressed count R is updated to record the fact of a positive comparison between the numbers 52 and 55, for example, whether by incrementing by one or more each time, by decrementing by one or more each time, or by some other technique, so long as R is updated in a manner that a meaningful value can be read when necessary.

A table such as that illustrated in FIG. 8 is also optionally included as part of a software package used by failure analysis engineers in order to relate the compressed count R to the actual count A in those cases where an estimate of A needs to be known. (In most cases, the memory system firmware can operate from the count R itself since its relationship to the count A is a known one.) For a first group 93 of values of the compressed count R, in the left hand column, the actual count A, shown in the middle column, is the same. A statistical standard deviation of errors between R and A, given in the right-hand column, is zero for this group. In a next group 95 of the table of FIG. 8, corresponding to the second line of the table of FIG. 6, the values of R are not equal to the values of A. Rather, since each R count in this group is incremented approximately once for each two occurrences of A, the value of A is roughly 15, the top value of the first group 93, plus two times the number of counts R in the left column in excess of 15. Similarly, the value of A for any given value of R in a next group 97, corresponding to the third line of the table of FIG. 6, is the value of A for the top value 31 of R in the last group 95 plus roughly four times the counts of R in excess of that top count 31 of the prior group 95. This relationship continues through all possible values of the count R.

The relationship between the counts R and A are usually not those roughly determined as above, particularly as the value of R becomes high, because of the incremental contribution of a combination of the effects of different probability values in the different ranges of R represented by prior groups 93, 95, 97, etc. As a result, the middle column of the table of FIG. 8 includes an extra unknown term x. Although the relationship between R and A can be approximated by a mathematical model that includes the x terms, it is usually preferred to empirically generate the expectation values (i.e. the mean values) of A for each given R in the middle column of the table of FIG. 8. The memory system in which this process is being implemented is best operated by subjecting at least one group of blocks to a number of erase events, either actual or simulated, that extends from zero to the maximum number expected to be experienced by that type of memory. Both the compressed count R that is maintained by the system and an actual count A of the number of erase cycles are monitored during the test. The latter gives the values for the middle column of FIG. 8. By using the actual memory system to generate the actual counts A that correspond to the compressed counts R, various imperfections of the random number generator 51 and other portions of the system and process are taken into account. Mathematically modeling all such factors with accuracy is difficult.

The error numbers in the right-hand column of FIG. 8 are also best determined by such an empirical technique, when it is desired to include them. The counts R and A are maintained during a large number of cycles of a number of memory blocks, and the differences among the different blocks are statistically expressed in some manner, such as by a standard deviation of a population of such differences. This column can be useful for the purposes of evaluating various tradeoffs between desired precision and necessary memory space required to store the counts, and diagnoses by the user of the memory system, but will usually not be used by the controller 11 during operation of the system.

Although the examples described herein are for maintaining a count of the number of erase/rewrite cycles experienced by blocks of a flash EEPROM system, these techniques can also be applied with similar advantages to counting other events in such a system particularly when a separate count of an event is maintained for each block or group of blocks of memory cells. One example is to count the number of times that individual blocks are subjected to margin scanning data recovery techniques, as an indication of some problem with those blocks. Another example is to count the number of times that an error correction code (ECC) was actually engaged in order to recover the user data of an otherwise unreadable sector. Another is to keep track of the number of times that blocks need to have the data therein refreshed to their proper margin levels by scrubbing in order to compensate for disturbances that have occurred over time. In these and other situations, a large number of such events experienced by a block, a sub-block (sector), or a group of blocks gives an indication that there is some problem with them. This information can be used by the memory controller to replace the block, sub-block, or the group of troubled blocks, or take some other remedial action.

Further, the counting techniques described above are not limited to use with flash EEPROM or other non-volatile memory systems. These techniques have application in any electronic system where it is necessary or desirable to keep a count of one or more events occurring in the course of the operation or by the use of the system.

Although the various aspects of the present invention have been described with respect to specific exemplary embodiments, it will be understood that the invention is entitled to protection within the full scope of the appended claims.

Appendix

A New Compressed Stochastic Integer Event Counter Scheme

This idea is applicable to any situation when a record of the number of times a certain event has occurred must be kept. The usual way of keeping track of the number of times an event has occurred is to devise a counter that is incremented every time an event takes place. If the maximum number of times the event can possibly occur is M times, then to store this information the counter requires $N=\log_2 M$ bits. So, as an example, if one wants to keep track of up to 1 million events, then one is forced to devote 20 bits≈3 Bytes to the storing of this count. Note that 20 bits=2.5 Bytes=20 bits, and $2^{20}=1048576$. Now, if many such event counters are required, then the total memory required to store all the counts can be substantial. This is exactly the case when it comes to implementing hot counts in flash memories on the basis of one counter per sector. Also, the updating of the hot count of each sector on every occasion that the sector is either programmed or erased can be a burden in terms of both performance speed of the memory and the wear produced by the frequent updating of the each sector's hot count. Each 512 Byte sector which has included hot count has traditionally required 3 extra Bytes to store the number of times the sector has been cycled (programmed and erased).

The Simple Approach Using a Fixed Probability of Incrementation

The new idea allows the compression of the 3 hot count Bytes per sector to 1 hot count Byte per sector. If one is willing to give up precision, then in its simplest form, the new hot count scheme is as follows: using a 12 bit pseudo-random number generator, one can generate a probability p (in this case p=1/4096=0.0002441) One way of generating this probability is by generating a random 12 bit binary integer on every occasion that a sector is being programmed, or erased. If this 12 bit integer matches a particular 12 bit integer (say 101111010001), then, and only then, will the counter corresponding to the sector that is about to be written be incremented. Note that $2^{12}=4096$. Every time a sector is programmed, there is a probability p that the counter of this sector is increment by the integer value 1. On the average, every 4096 programming events will increment the counter once.

Now, we have to distinguish between the actual count, A, which is the actual number of times a given sector has been programmed, and the representation of this count, R, which is roughly 4096 times smaller than A. What we record and keep track of is R=r. The value of R at any given time will not exactly determine the value of A=a, but will give a ball park estimate of the value of A. When R is small, then R is a very poor indicator of A, but as R becomes larger, then R becomes a more accurate indicator of A in a relative sense. Here "R", and "A" represent random variables, whereas "r", and "a" represent certain integer values that these random variables can take.

We can define E as the event of R being incremented. Then: Probability (E)=Pr(E)=p, and Probability (not E)=Pr($\bar{E}$)=1−p "r"=number of times that E occurs in "a" trials=random variable with probability density function f(r|a) given by the binomial distribution:

Pr(R=r|A=a)=f(r|a)=(a!/(r!(a−r)!))$p^r(1-p)^{(a-r)}$

{The mean value of R}=Exp(R)=a·p, and

{The standard deviation of R}=SD(R)=√[a·p·(1−p)]

The above formulas are well known for the binomial distribution.

For the purposes of this hot count scheme we need to know the expectation value of A given some known value of R, and the standard deviation of A given some known value of R. This is because at any given time only the value of R is stored and can be retrieved, and no knowledge of the exact value of A has been retained.

One is tempted to write Exp(A|R=r)=r/p. While this may be correct, to be sure, Bayes Theorem has to be invoked to derive an expression for Pr(R=r|A=a)=f(a|r), and then this probability density function can be used to calculate Exp (A|R=r), and SD(A|R). Bayes Theorem states the following:

$$[\Pr(A=a \mid R=r)] \equiv \left[ \frac{\Pr(R=r \mid A=a) \cdot \Pr(A=a)}{\Pr(R=r)} \right]$$

The denominator of the right hand side of the above equation can be rewritten by using the following identity:

$$\Pr(R=r) = \sum_{s=r}^{M} \Pr(R=r \ \& \ A=s)$$

where we know the actual count A can never be smaller than the representation R (hence the summation starts from r), and we assume that the actual count A can never exceed some large number M (say: M=1000000 or M=10000000). Therefore {A=r, A=r+1, A=r+2, . . . , A=M} forms a partition. Also, by the definition of conditional probability:

$$\sum_{s=r}^{M} \Pr(R=r \ \& \ A=s) \equiv \sum_{s=r}^{M} \Pr(R=r \mid A=s) \cdot \Pr(A=s)$$

There is a theorem in statistics called "The Admissibility of Uniform Distribution for Bayesian Estimates" that states in cases such as we have here, it is safe to assume that the random variable A is uniformly distributed. In other words, if we assume that the actual count can never exceed M, and we do not know the value of the representation R, then the value of A at some random instance in time can be any integer from 0 to M, with each integer value having the same likelihood as any other. Therefore, Pr(A=s)=constant=(1/(M+1)), and we can pull this constant out of the summation:

$$\left[ \sum_{s=r}^{M} \Pr(R=r \mid A=s) \cdot \Pr(A=s) \right] = \left[ \Pr(A=s) \cdot \sum_{s=r}^{M} \Pr(R=r \mid A=s) \right]$$

and because A is uniformly distributed we know that Pr(A=s)=Pr(A=a) for any value of s, and any value of a:

$$[\Pr(A=a \mid R=r)] = \left[ \frac{\Pr(R=r \mid A=a) \cdot \Pr(A=a)}{\Pr(R=r)} \right]$$

$$= \left[ \frac{\Pr(R=r \mid A=a) \cdot \Pr(A=a)}{\sum_{s=r}^{M} [\Pr(R=r \ \& \ A=s)]} \right]$$

$$= \left[ \frac{\Pr(R=r \mid A=a) \cdot \Pr(A=a)}{[\Pr(A=s)] \sum_{s=r}^{M} [\Pr(R=r \mid A=s)]} \right]$$

$$= \left[ \frac{\Pr(R=r \mid A=a)}{\sum_{s=r}^{M} [\Pr(R=r \mid A=s)]} \right]$$

$$= \frac{\binom{a}{r} p^r (1-p)^{(a-r)}}{\sum_{s=r}^{M} \binom{s}{r} p^r (1-p)^{(a-r)}}$$

where:

$$\binom{a}{r} = \frac{a!}{r!(a-r)!}$$

Therefore:

$$[\Pr(A=a \mid R=r)] = \frac{\binom{a}{r} p^r (1-p)^{(a-r)}}{\sum_{s=r}^{M} \binom{s}{r} p^r (1-p)^{(s-r)}}$$

$$= \frac{\frac{a!}{r!(a-r)!} p^r (1-p)^{(a-r)}}{\sum_{s=r}^{M} \frac{s!}{r!(s-r)!} p^r (1-p)^{(s-r)}}$$

$$= \frac{\frac{a!}{r!(a-r)!} p^r (1-p)^{(a-r)}}{\frac{1}{r!} \sum_{s=r}^{M} \frac{s!}{(s-r)!} p^r (1-p)^{(s-r)}}$$

$$= \frac{\frac{a!}{(a-r)!} p^r (1-p)^{(a-r)}}{\sum_{s=r}^{M} \frac{s!}{(s-r)!} p^r (1-p)^{(s-r)}}$$

-continued $$= \frac{\left[\prod_{i=0}^{(a-r+1)} (a-i)\right] p^r (1-p)^{(a-r)}}{\sum_{s=r}^{M} \left[\prod_{i=0}^{(a-s+1)} (a-i)\right] p^r (1-p)^{(s-r)}}$$

$$= \frac{p^r (1-p)^{(a-r)} \left[\prod_{i=0}^{(a-r+1)} (a-i)\right]}{p^r \sum_{s=r}^{M} \left[\prod_{i=0}^{(a-s+1)} (a-i)\right] (1-p)^{(s-r)}}$$

$$= \frac{(1-p)^{(a-r)} \left[\prod_{i=0}^{(a-r+1)} (a-i)\right]}{\sum_{s=r}^{M} \left[\prod_{i=0}^{(a-s+1)} (a-i)\right] (1-p)^{(s-r)}}$$

$$= f(a \mid r)$$

$$= \text{probability that } (A = a) \text{ given that } (R = r)$$

The average value of A given R=r is given by:

$$\text{Exp}(A \mid R = r) = \sum_{a=0}^{M} a \cdot f(a \mid r)$$

The variance of (A|R=r) is:

$$\text{Var}(A \mid R = r) = \text{Exp}(A^2 \mid R = r) - [\text{Exp}(A \mid R = r)]^2$$

$$= \left[\sum_{a=0}^{M} a^2 \cdot f(a \mid r)\right] - \left[\sum_{a=0}^{M} a \cdot f(a \mid r)\right]^2$$

The Standard Deviation of A given R=r is:

$$\text{SD}(A \mid R = r) = \sqrt{\text{Exp}(A^2 \mid R = r) - [\text{Exp}(A \mid R = r)]^2}$$

$$= \sqrt{\left[\sum_{a=0}^{M} a^2 \cdot f(a \mid r)\right] - \left[\sum_{a=0}^{M} a \cdot f(a \mid r)\right]^2}$$

As is apparent from the above formulas, even in this simple case where p=constant, the calculations require computer programs. However, Wald's Equation (See the book STOCHASTIC PROCESSES by Sheldon M. Ross, from John Wiley & Sons (1983) pp 59) can be used to readily arrive at the following expression for: Exp(A|R=r)=Exp(R|A=a)/p=r/p. Therefore, in the case that p=1/4096, then: Exp(A|R=r)=4095·r.

Another method of calculating both the expectation values, and the standard deviations of A, given some value of R=r is by performing Monte Carlo Simulations. These simulations are particularly useful when a more complicated algorithm is adopted such as the "r dependent p value algorithm" discussed in the next section. Also since any random number generating scheme really generates a pseudo-random number with a distribution that may not be perfectly uniform, the best platform on which to perform the Monte Carlo simulation consists of the same processor and firmware that will go into production. In this way, the imperfections of the random number generating scheme are also incorporated into the simulation.

The Monte Carlo simulation for this simple case will consist of 2 phases. The first phase consists of two loops, with one loop nested inside the other loop. The inner loop will increment the actual count "a" by one upon every pass. Also every time the integer "a" is incremented, a 12 bit random binary integer, b, is generated, if and only if this integer becomes equal to "101111010001", then the representation "r" is incremented. As discussed previously the probability for such a match is 1 in 4096. Note that both "a" and "r" are set to zero within the outer loop, and outside the inner loop. This allows every trial to start with a=0 and r=0. The inner loop is repeated as long as r<256. On the average the inner loop will be run 1 million times. The inner loop simulates what happens to the hot count of a single sector as the sector is cycled for roughly one million times (until r saturates at $255_{10}$=$11111111_2$). This can be referred to as a single trial. On the other hand, the outer loop simulates many trails. The outer loop can be run 10000 times to produce a statistically significant sample of many trials. In order to minimize the data that has to be stored during the first phase, we need only to record those values of "a" which correspond to incrementing "r". One file can be devoted to each fixed value of "r". So, for example, the file named r123 out will contain 10000 integers which are the values of "a" each time "r" just became 123 across the 10000 trails. We will produce 255 output files. In phase 2, each of the 255 output files is processed to obtain the mean and the standard deviation for each of the 255 nonzero values of "r".

A More Complex Approach Using a Variable Probability Value of Incrementation

A more complex algorithm can be adopted in order to keep the ratio of (the standard deviation of A given R=r) to (the expectation value of A given R=r) more or less constant for different values of "r". This is useful because it limits the relative uncertainty in the value of "a" based on the knowledge of the value of "r". In this new scheme, the probability "p" that "r" gets incremented is related to the current value of "r".

If  $0 \leq r < 16$,    then p = $½^0$ = 1.0
If $16 \leq r < 32$,   then p = $½^1$ = ½ = 0.5
If $32 \leq r < 48$,   then p = $½^2$ = ¼ = 0.25
If $48 \leq r < 64$,   then p = $½^3$ = ⅛ = 0.125
    .                        .
    .                        .
    .                        .
If $240 \leq r < 256$, then p = $½^{15}$ = $\frac{1}{32768}$ = 0.0000305

"r" can be represented as a simple count from 00000000 to 11111111 in binary form, with a decimal equivalence being from 0 to 255. In Hex, the value of "r" can range from 00h to FFh. Each user of the hot count "r" will be provided with a table that provides a mean value of A, and a standard deviation of A for each of the 256 different values of "r". Alternatively, "r" can be represented in the form of a 4 bit mantissa and a 4 bit exponent, as discussed later. But this later representation is cumbersome at best.

The Monte Carlo simulation for this scheme is very similar to the previously discussed simple scheme, with the difference that now the value of "p" will depend on the current value of "r", as explained above.

A New Hot Count and Counters Scheme for a Specific Memory

Each page (64 sectors) will have a single, Byte long, hot count that will be stored out of the page itself, and in a table in another page. The hot count will be updated in the controller RAM every time it is decided that the count requires incrementing. Every time a page is erased a decision will be made to either increment the corresponding hot count or not to increment it. In this scheme the chances of incrementing the hot count will roughly be inversely proportional to the present value of the count.

The table containing the hot counts will have to be about 5000 Bytes in order to contain the hot counts of about 5000 pages. Assuming $2^{30}=1$ Gbit, then 4096 pages are required to have a user capacity of 1 Gbit. A table consisting of only 10 sectors will be able to contain the hot counts of the entire chip. Each subsequent Byte of this table corresponds to the hot count of the next physical page. As several pages are being written, the hot counts can be updated in the RAM, until a partition boundary is encountered, at which point the sector containing the hot count table corresponding to the partition is updated in one shot. We can define a hot count table as consisting of 64 Bytes each of which is the hot count of a single page which belongs to the same partition. One hot count table is not split across two sectors (i.e. each "hot count table sector" contains 8 entire "hot count tables").

Every time a read or write operation crosses over a partition boundary, then one hot count table sector is updated, and all hot count table sectors are read and processed so that wear leveling, scrubbing, and retirement activity may now be performed. The logical order of the hot count Bytes represents the physical order of the corresponding pages. Also, The logical order of the hot count tables represents the physical order of the corresponding partitions.

Updating of a hot count sector will normally not even require an erase, because as with any other sector, the updating of a sector only requires writing the sector data in a new pre-erased sector, and updating the map to reflect where the most recent version of the data resides. Since a partition consists of 64 pages, the hot counts corresponding to the partition will be 64 bites only. In this scheme the single Byte hot count of each page is incremented only 256 times during a million cycles. So, even if we would update the hot count of each page as soon as it was incremented, and the sector containing the hot counts of 512 pages were never moved around, then the hot count table sector would be updated 512*256=131072 times. This assumes that each and every one of these 512 pages have been cycled 1 million times. If user sectors can tolerate 1 million cycles, then hot count sectors too can tolerate 131 thousand cycles.

The Hot Count Scheme

The 8 bit count corresponding to each page will consist of 4 bits of mantissa, M, and 4 bits of exponent, E. So if the hot count reads: 01010010, then $M=0101_2=5_{10}$ and $E=0010_2=2_{10}$. Because in this example the exponent is $2_{10}$, we have to add a corrective term, $A=1100_2$ to the mantissa to generate an effective Mantissa, N, where N=N(E), and A=A(E) are functions of E. Now the actual hot count in base 10 is: $N(E)_{10}*2_{10}**E_{10}=[M+A(E)]*(2**E)$
Alternatively, the hot count in base 2 is: $N(E)*(10)**E$
For counts from 0 to 15 every erase of the page will increment the hot count with 100% certainty. For counts from 16 to 46 every erase has a 50% chance of incrementing the hot count.

In general the probability, p, of incrementing is a function of E given by: $p=1/(2**E)$
The following are values of A(E):

A(0000)=0000,
A(0001)=1000,
A(0010)=1100,
A(0011)=1110,
A(0100)=1111,
A(0101)=1111,
A(0110)=1111,
A(0111)=1111,
. . .
A(1111)=1111

The largest possible number, L, is given by M=1111, and E=1111
$L=(1111+1111)*((10)**(1111)=1015792_{10}$
The smallest p is 1/32768.

This same methodology can be applied to counts of counter activity also. Please see the attached Excel Worksheet for the details of this scheme. Because cycled cells age more slowly when they have been cycled many times, as compared to the beginning of life, this proportionate hot count will have enough resolution for both wear leveling and retirement purposes.

It is claimed:

1. A circuit, comprising:
    a memory maintaining a compressed count of the number of occurrences of an event; and
    a incrementer connected to said memory maintaining the compressed count to update the compressed count in response to an occurrence of said event, the incrementer comprising:
        a random number generator connected to receive an enable signal provided in response to the occurrence and generate a random or pseudo-random number in response thereto;
        a memory storing a predetermined number; and
        a comparator connected to the memory storing a predetermined number and to the random number generator to receive the generated random or pseudo-random number, wherein the compressed count is updated when generated random or pseudo-random number matches the predetermined number.

2. The circuit of claim 1, wherein the incrementer further comprises:
    a seed source connected to provide a seed value to the random number generator.

3. The circuit of claim 1, wherein the compressed count is updated by incrementing its value by one.

4. The circuit of claim 1, wherein the compressed count is updated by decrementing its value by one.

5. The circuit of claim 1, wherein the circuit further comprises:
    a non-volatile memory, wherein said event is an erase operation in said memory.

6. The circuit of claim 5, wherein the memory maintaining a compressed count is part of said non-volatile memory.

7. The circuit of claim 5, wherein the circuit further comprises:
    an interface to receive an instruction to issue an erase command and connected to the non-volatile memory and to the incrementer, whereby said erase operation is performed and said enable signal is provided.

8. The circuit of claim 7, wherein the circuit further comprises:
    a power supply connected to the interface and the non-volatile memory, whereby voltage pulses are generated and supplied to said non-volatile memory in response to the erase command.

9. A method, comprising:
    determining whether an event has occurred;
    generating a random or pseudo-random number in response to said event occurring;

comparing the generated random or pseudo-random number to a predetermined number; and updating a compressed count of the number of occurrences of said event if the generated random or pseudo-random number matches the predetermined number.

10. The method of claim 9, wherein said event is an erase operation in a non-volatile memory.

11. The method of claim 9, further comprising:

reading the compressed count; and determining from the value of the compressed count the number of bits of said generated random or pseudo-random number and said predetermined number to compare in said comparing.

12. The method of claim 9, wherein the compressed count is updated by incrementing its value by one.

13. The method of claim 9, wherein the compressed count is updated by decrementing its value by one.

* * * * *